US011449774B2

(12) United States Patent
Chen et al.

(10) Patent No.: US 11,449,774 B2
(45) Date of Patent: Sep. 20, 2022

(54) RESOURCE CONFIGURATION METHOD AND APPARATUS FOR HETEROGENEOUS CLOUD SERVICES

(71) Applicant: Beijing Baidu Netcom Science and Technology Co., Ltd., Beijing (CN)

(72) Inventors: Xiaoxu Chen, Beijing (CN); Feng Liu, Beijing (CN); Tao Yang, Beijing (CN); Xiang Gao, Beijing (CN); Geng Li, Beijing (CN); Xianghui Zhang, Beijing (CN)

(73) Assignee: Beijing Baidu Netcom Science and Technology Co., Ltd., Beijing (CN)

( * ) Notice: Subject to any disclaimer, the term of this patent is extended or adjusted under 35 U.S.C. 154(b) by 441 days.

(21) Appl. No.: 16/700,651

(22) Filed: Dec. 2, 2019

(65) Prior Publication Data

US 2020/0401913 A1 Dec. 24, 2020

(30) Foreign Application Priority Data

Jun. 19, 2019 (CN) .......................... 201910531492.X (51) Int. Cl.
*G06F 15/16* (2006.01)
*G06N 5/04* (2006.01)
(Continued)

(52) U.S. Cl.
CPC .............. *G06N 5/04* (2013.01); *G06F 30/27* (2020.01); *G06N 20/00* (2019.01); *H04L 67/10* (2013.01);
(Continued)

(58) Field of Classification Search
CPC .......... G06N 5/04; G06N 20/00; G06F 30/27; G06F 9/5077; G06F 2209/5011; H04L 67/10
(Continued)

(56) References Cited

U.S. PATENT DOCUMENTS 9,324,034 B2 * 4/2016 Gupta .................... G06N 5/043
9,684,870 B2 * 6/2017 Fawaz .................... G06N 5/025
(Continued)

FOREIGN PATENT DOCUMENTS

CN 105868073 A 8/2016
CN 106874280 A 6/2017
(Continued)

*Primary Examiner* — Moustafa M Meky
(74) *Attorney, Agent, or Firm* — Nixon Peabody LLP (57) ABSTRACT

A resource configuration method and apparatus for heterogeneous cloud services are provided. The method may include: establishing a basic model with a general structure for at least two heterogeneous cloud services, where the basic model comprises a trend model and a periodic model; determining a cloud service in the at least two cloud services as a target cloud service, and acquiring a target historical data set of the target cloud service; training the trend model and the periodic model using the target historical data set; generating a target prediction model corresponding to the target cloud service based on the trained trend model and the trained periodic model; and generating, based on the target prediction model, a resource amount demanded by the target cloud service in a future time period, and configuring resources for the target cloud service according to the demanded resource amount.

20 Claims, 7 Drawing Sheets (51) Int. Cl.
  *G06N 20/00*   (2019.01)
  *G06F 30/27*   (2020.01)
  *H04L 67/10*   (2022.01)
  *G06F 9/50*    (2006.01)
(52) U.S. Cl.
  CPC .... *G06F 9/5077* (2013.01); *G06F 2209/5011* (2013.01)
(58) Field of Classification Search
  USPC ........................................................ 709/200
  See application file for complete search history.

(56) References Cited

U.S. PATENT DOCUMENTS

| | | | |
|---|---|---|---|
| 10,089,582 B2 * | 10/2018 | Fawaz | G06N 5/025 |
| 2003/0149685 A1 | 8/2003 | Trossman | |
| 2013/0304676 A1 * | 11/2013 | Gupta | G06N 5/043 |
| | | | 706/12 |
| 2013/0304677 A1 * | 11/2013 | Gupta | H04W 12/37 |
| | | | 706/12 |
| 2015/0356462 A1 * | 12/2015 | Fawaz | G06N 20/00 |
| | | | 706/12 |
| 2020/0126012 A1 * | 4/2020 | Bailey | G06N 7/005 |
| 2021/0182106 A1 | 6/2021 | Wang | |

FOREIGN PATENT DOCUMENTS

| | | | |
|---|---|---|---|
| CN | 106961351 A | 7/2017 | |
| CN | 108011764 A | 5/2018 | |
| CN | 109412829 A | 3/2019 | |
| CN | 109714395 A | 5/2019 | |

\* cited by examiner

RESOURCE CONFIGURATION METHOD AND APPARATUS FOR HETEROGENEOUS CLOUD SERVICES

CROSS-REFERENCE TO RELATED APPLICATIONS

This application claims priority to Chinese Patent Application No. 201910531492.X, filed with the China National Intellectual Property Administration (CNIPA) on Jun. 19, 2019, the contents of which are incorporated herein by reference in their entirety.

TECHNICAL FIELD

Embodiments of the present disclosure relate to the field of cloud computing technology, and specifically to a resource configuration method and apparatus targeting heterogeneous cloud services.

BACKGROUND

Generally, in the prior art, cloud computing can be interpreted as an on-demand and pay-as-you-go mode. The core is integrating all resources on networks into a configurable computing resource sharing pool called "cloud" through the Internet (the resources include networks, servers, memories, application software, and services), and then uniformly managing and scheduling the resource pool to provide users with virtual, dynamic, on-demand, and flexible services. Cloud computing is gradually developed into comprehensive technical services based on computer technology, communication technology, storage technology and database technology.

SUMMARY

Embodiments of the present disclosure provide a resource configuration method and apparatus for cloud heterogeneous services.

According to a first aspect, some embodiments of the present disclosure provide a resource configuration method for cloud heterogeneous services, the method including: establishing a basic model with a general structure for at least two heterogeneous cloud services, wherein the basic model comprises a trend model and a periodic model; determining a cloud service in the at least two cloud services as a target cloud service, and acquiring a target historical data set of the target cloud service; training the trend model and the periodic model using the target historical data set, to generate a trained trend model and a trained periodic model; generating a target prediction model corresponding to the target cloud service based on the trained trend model and the trained periodic model; and generating, based on the target prediction model, a resource amount demanded by the target cloud service in a future time period, and configuring resources for the target cloud service according to the demanded resource amount.

According to a second aspect, some embodiments of the present disclosure provide a resource configuration apparatus for heterogeneous cloud services, including: an establishing unit, configured to establish a basic model with a general structure for at least two heterogeneous cloud services, wherein the basic model comprises a trend model and a periodic model; an acquiring unit, configured to determine a cloud service in the at least two cloud services as a target cloud service, and acquire a target historical data set of the target cloud service; a first generating unit, configured to train the trend model and the periodic model using the target historical data set, to generate a trained trend model and a trained periodic model; a second generating unit, configured to generate a target prediction model corresponding to the target cloud service based on the trained trend model and the trained periodic model; and a configuration unit, configured to generate, based on the target prediction model, a resource amount demanded by the target cloud service in a future time period, and configure resources for the target cloud service according to the demanded resource amount.

According to a third aspect, some embodiments of the present disclosure provide an electronic device, including: one or more processors; and a storage apparatus, storing one or more programs, the one or more programs, when executed by the one or more processors, causing the one or more processors to implement the method according to anyone of the implementations of the first aspect.

According to a fourth aspect, some embodiments of the present disclosure provide a computer-readable storage medium, storing a computer program thereon, wherein the computer program, when executed by one or more processors, implements the method according to any one of the implementations of the first aspect.

The resource configuration method and apparatus for heterogeneous cloud services, by establishing a basic model with a general structure for at least two heterogeneous cloud services, wherein the basic model comprises a trend model and a periodic model; determining a cloud service in the at least two cloud services as a target cloud service, and acquiring a target historical data set of the target cloud service; training the trend model and the periodic model using the target historical data set, to generate a trained trend model and a trained periodic model; generating a target prediction model corresponding to the target cloud service based on the trained trend model and the trained periodic model; and generating, based on the target prediction model, a resource amount demanded by the target cloud service in a future time period, and configuring resources for the target cloud service according to the demanded resource amount, achieves technical effects, the technical effects include: providing a resource configuration manner for heterogeneous cloud services.

BRIEF DESCRIPTION OF THE DRAWINGS

After reading detailed descriptions of non-limiting embodiments with reference to the following accompanying drawings, other features, objectives and advantages of the present disclosure will become more apparent.

DETAILED DESCRIPTION OF EMBODIMENTS

Embodiments of present disclosure will be described below in detail with reference to the accompanying drawings. It should be appreciated that the specific embodiments described herein are merely used for explaining the relevant disclosure, rather than limiting the disclosure. In addition, it should be noted that, for the ease of description, only the parts related to the relevant disclosure are shown in the accompanying drawings.

It should also be noted that the some embodiments in the present disclosure and some features in the disclosure may be combined with each other on a non-conflict basis. Features of the present disclosure will be described below in detail with reference to the accompanying drawings and in combination with embodiments.

Figure 1:
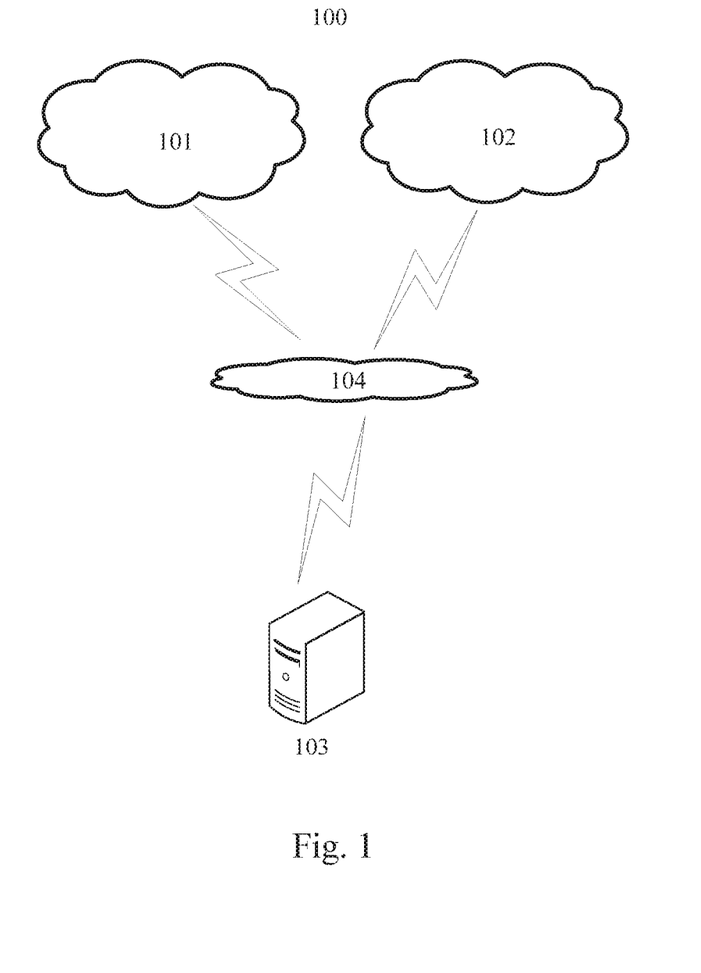
FIG. 1 is an architectural diagram of an example system in which embodiments of the present disclosure may be implemented.

FIG. 1 shows an example system architecture 100 in which a resource configuration system targeting heterogeneous cloud services may be implemented.

As shown in FIG. 1, the system architecture 100 may include a cloud resource pool 101 or 102, a device 103, and a network 104.

Here, a cloud computing management platform may virtualize a server, a storage device, or a network device into dozens or even hundreds of logical units from the perspective of logics. These units may be combined on the cloud computing management platform to form a plurality of virtual machines (also referred to as cloud resource pools). A user, for example, an enterprise user, may request a cloud service from the cloud computing management platform, the cloud computing management platform may generate a corresponding cloud resource pool for the enterprise user, and the cloud resource pool may provide the cloud service to the enterprise user. Moreover, the cloud computing management platform can provide virtual, dynamic, on-demand, and flexible services to the user by dynamically managing the cloud resource pool, so that the resources in the cloud resource pool match the demands of the user. It should be noted that the enterprise user can provide various services to a terminal user through cloud services.

Here, the network 104 serves as a medium providing a communication link between the server and the cloud resource pool. The network 104 may include various types of connections, such as wired or wireless communication links, or optical fiber cables.

The device 103 may be a hardware device or software that supports network connections so as to provide various network services. When the device is hardware, the device may be various electronic devices, including but not limited to a smart phone, a tablet computer, a laptop computer, a desktop computer, a server, etc. The hardware device may be implemented as a distributed device group composed of a plurality of devices, or as a single device. When the device is software, the device may be installed in the above-listed electronic devices. The software may be implemented, for example, as a plurality of software programs or software modules for providing distributed services, or as a single software program or software module. Specific limitations are not provided here.

It should be appreciated that the numbers of the cloud resource pools, the device, and the network in FIG. 1 are merely illustrative. Any number of cloud resource pools, devices, and networks may be provided based on implementation requirements.

Figure 2:
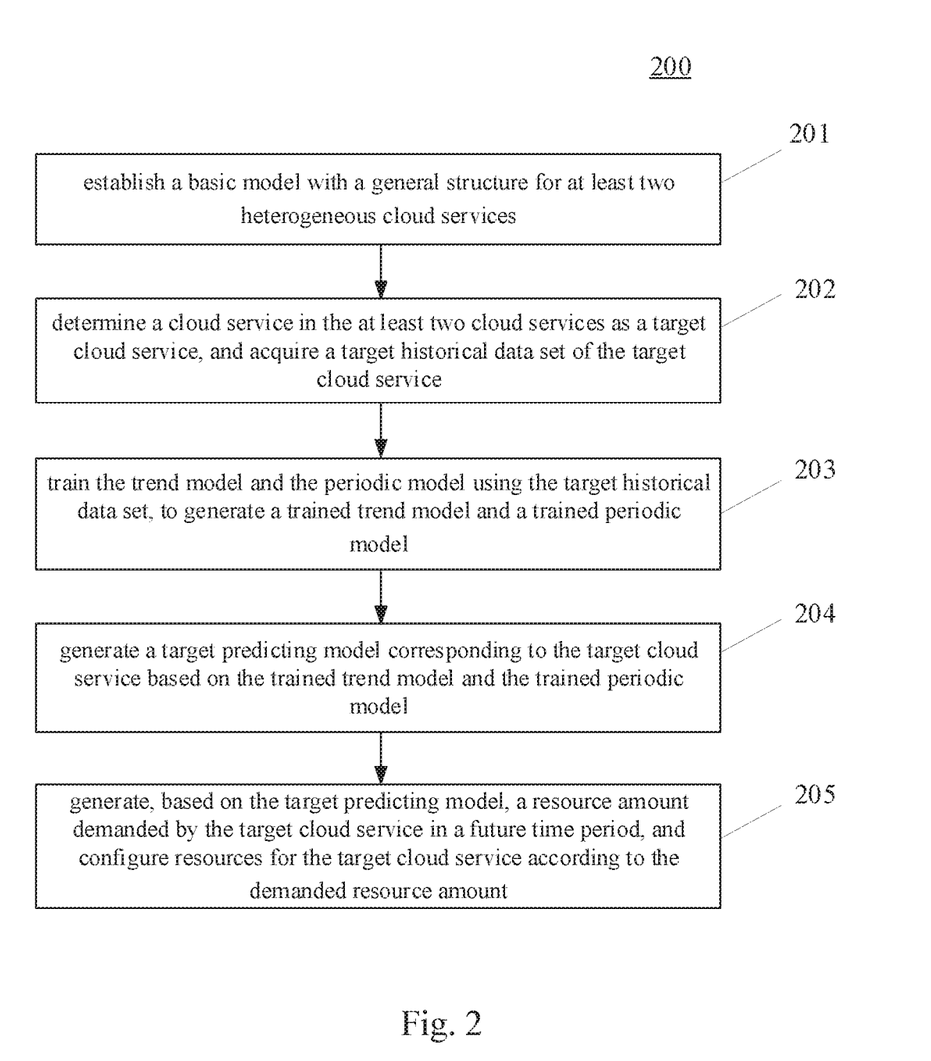
FIG. 2 is a flowchart of a resource configuration method targeting heterogeneous cloud services according to an embodiment of the present disclosure.

Referring to FIG. 2, a flow 200 of an embodiment of a resource configuration method for heterogeneous cloud services is shown. The flow 200 of the resource configuration method for heterogeneous cloud services includes the following steps.

Step 201: establishing a basic model with a general structure for at least two heterogeneous cloud services.

In the present embodiment, the executing body (for example, the device 103 in FIG. 1) of the resource configuration method for heterogeneous cloud services may establish the basic model with a general structure for at least two heterogeneous cloud services.

It can be understood that the cloud service may be a service provided to a user. Since the demands of different users may be different, data contents provided to the users, resource pools prepared for users, and the like may be different. For example, the cloud service that the user applies for a search service and the cloud service that the user applies for a cloud disk storage service may be different from multiple aspects (e.g., the provided data contents, resource pools, etc.). In this case, the two cloud services may be considered heterogeneous. Due to the large difference in trends of resource amount demanded by the heterogeneous cloud services, for example, some are obvious in periodicity while some are not, some increase over time while some growth trends are not obvious, and so on.

In the prior art, a corresponding single cloud service prediction model is generally established for each of heterogeneous cloud services, and the single prediction model predicts the resource amount demanded by the cloud service in a future time period. In the prior art, since the single cloud service prediction model is used, original models of different structures are established for cloud services, and then trained to obtain a cloud service prediction model. For increasingly diverse cloud services, the targeted establishment of single cloud service prediction models requires a lot of resources and time. Moreover, for a cloud service initially established, because the cloud service does not have sufficient historical data, the single cloud service prediction model is difficult to be trained. If the initial model is not pre-judged, the accurate demanded resource amount cannot be predicted at the preliminary stage of the cloud service.

By using the basic model of a general structure in some embodiments of the present disclosure, the model structure does not need to be adjusted for heterogeneous cloud services, which reduces the step of constructing original models one by one for multiple cloud services, thereby reducing the waste of computing resources, and saving time for establishing the models to implement prediction as early as possible.

In the present embodiment, the basic model may include a trend model and a periodic model.

Here, the trend model may characterize the trend change rule of the demanded resource amount, that is, the input and output of the trend model conform to the trend change rule characterized by the trend model. The periodic model may characterize the periodic change rule of the predicted demanded resource amount, that is, the input and output of the periodic model conform to the periodic change rule characterized by the periodic model.

Step 202: determining a cloud service in the at least two cloud services as a target cloud service, and acquiring a target historical data set of the target cloud service.

In the present embodiment, the executing body may determine the cloud service in the at least two cloud services as a target cloud service, and acquire the target historical data set of the target cloud service.

It can be understood that the historical data may include the number of CPUs, storage space, and the like. For different cloud services, the historical data in the historical data set may be different.

Here, the target historical data set may include historical data corresponding to a historical time.

Step 203: training a trend model and a periodic model using the target historical data set, to generate a trained trend model and a trained periodic model.

In the present embodiment, the executing body may train the trend model and the periodic model using the target historical data set, to generate the trained trend model and the trained periodic model.

Alternatively, the trend model may be based on various structures. As an example, the trend model may be fitted using a logistic regression. For a multi-segment trend change, points where the growth rate changes in the trend may be specified by a user in advance or may be automatically monitored. These points are processed using a piecewise function, and then input into the trend model based on logistic regression, to ensure the continuity of the entire trend model.

Alternatively, the periodic model may be based on various structures. As an example, the periodic model may be fitted using a Fourier series. Fourier technology may decompose a complicated periodic trend into a combination of simple trigonometric functions (sine function, cosine function) and constant terms, to approximate a function of any period. Therefore, the above periodic rule can be characterized using the periodic model based on Fourier series.

Alternatively, the trend model and the periodic model may be separately trained. The target historical data set is input to the trend model, and feedback regulation is performed on the trend model (parameter) based on the output of the trend model; the target historical data set is input to the periodic model, and feedback regulation is performed on the periodic model (parameter) based on the output of the periodic model.

Alternatively, the trend model and the periodic model may be jointly trained. The first output result of the trend model and the second output result of the periodic model may be combined as an output result of a to-be-trained target prediction model. The target historical data set is input into the trend model and the periodic model, and the trend model (parameter) and the periodic model (parameter) are adjusted based on the output result of the target prediction model.

Step 204: generating a target prediction model corresponding to the target cloud service based on the trained trend model and the trained periodic model.

In the present embodiment, the executing body may generate the target prediction model corresponding to the target cloud service based on the trained trend model and the trained periodic model.

In the present embodiment, the executing body may combine the first output result of the trend model and the second output result of the periodic model as an output result of the target prediction model.

Alternatively, the first output result and the second output result may be combined by directly being added together, to work as an output result of the target prediction model; or the first output result and the second output result may be combined by respectively being weighted and summed, to work as an output result of the target prediction model.

Alternatively, other factors (e.g., noise factor and burst factor) may be introduced and combined with the first output result of the trend model and the second output result of the periodic model, to work as an output result of the target prediction model.

It can be seen from the output result of the target prediction model that, the structure of the target prediction model may be various on the basis of the trend model and the periodic model, which is not limited herein.

Alternatively, the basic model may include a burst factor model, the input of the burst factor model may be a burst demanded amount specified (by a worker), and the third output result of the burst factor model may be used to generate an output result of the target prediction model.

It should be noted that some deterministic burst factors, such as holidays, may be expected to affect the resource amount demanded by cloud services. Therefore, the worker can input a burst demanded resource amount to the basic model through the burst factor model.

Step 205: generating, based on the target prediction model, a resource amount demanded by the target cloud service in a future time period, and configuring resources for the target cloud service according to the demanded resource amount.

In the present embodiment, the executing body may generate, based on the target prediction model, the resource amount demanded by the target cloud service in the future time period, and configure resources for the target cloud service according to the generated demanded resource amount.

In the present embodiment, the generating, based on the target prediction model, the demanded resource amount may include: inputting a historical resource amount demanded by the target cloud service in a historical time period into the target prediction model, to generate the demanded resource amount in the future time period. The historical time period and the future time period have a preset corresponding relationship. For example, the demanded resource amount in June 2019 may be predicted from the demanded resource amount in June 2018. The corresponding relationship between June 2018 and June 2019 is preset.

In the present embodiment, the resources of the target cloud service are configured according to the generated demanded resource amount, and the resources required in the future time period may be prepared for the target cloud service in advance. If the amount of resources required in the future is large, the pre-configuration can ensure that the resources are provided in time when the cloud service has a demand, thereby avoiding lag or speed drop of the cloud service due to insufficient resources. If the amount of resources required in the future is small, the pre-configuration can avoid waste of resources.

In the resource configuration method for heterogeneous cloud services according to some embodiments of the present disclosure, a basic model with a general structure is first established for at least two heterogeneous cloud services, the basic model including a trend model and a periodic model; then, the trend model and the periodic model are trained using a target historical data set of a target cloud service; a target prediction model corresponding to the target cloud service is generated based on the trained trend model and the trained periodic model; and finally, a resource amount demanded by the target cloud service is generated based on the target prediction model, and resources of the target cloud service is configured according to the demanded resource amount. Therefore, the technical effects may at least include the following.

First, a resource configuration method for heterogeneous cloud services is provided.

Second, with the basic model of a general structure, the model structure does not need to be adjusted for heterogeneous cloud services, which reduces the step of constructing original models one by one for multiple cloud services, thereby reducing the waste of computing resources, and saving time for establishing the models to implement prediction as early as possible. Moreover, the establishment of the target prediction model has the adaptive ability, the model can be adaptively generated by a computer based on the general basic model and the target historical data set, without adjusting the parameter and the structure, and the generated target prediction model can keep high accuracy.

Third, the basic model including the trend model and the periodic model can be applied to different cloud services, and it has been proved that the basic model including the trend model and the periodic model is applied to different cloud services with an average precision more than 95%.

Fourth, the resources of the target cloud service are configured according to the generated demanded resource amount, and the resources required in the future time period may be prepared for the target cloud service in advance. If the amount of resources required in the future is large, the pre-configuration can ensure that the resources are provided in time when the cloud service has a demand, thereby avoiding lag or speed drop of the cloud service due to insufficient resources. If the amount of resources required in the future is small, the pre-configuration can avoid waste of resources.

Figure 3:
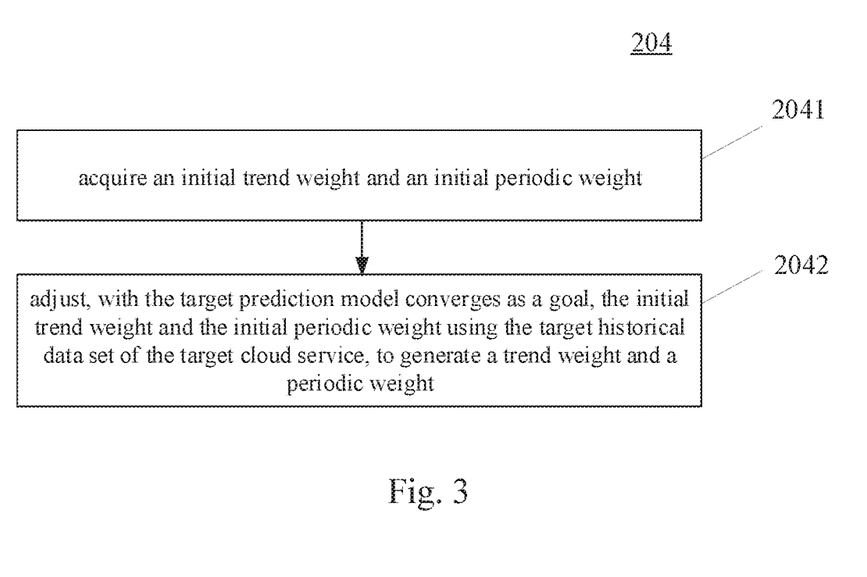
FIG. 3 is a schematic diagram of step 204 according to an implementation of the present disclosure.

In some embodiments, step 204 may be implemented by a flow 204 shown in FIG. 3. The flow 204 may include:

Step 2041: acquiring an initial trend weight and an initial periodic weight.

Here, the initial trend weight is used to weight the first output result of the trained trend model.

The initial periodic weight is used to weight the second output result of the trained periodic model.

The initial trend weight and the initial periodic weight may be set by a worker.

Step 2042: adjusting, with the target prediction model converges as a goal, the initial trend weight and the initial periodic weight using the target historical data set of the target cloud service, 1 to generate a trend weight and a periodic weight.

It can be understood that a loss function is usually set during training the model. The loss function converges (the output of the loss function becomes smaller) may be referred to as that the model converges.

In general, the model precision may be a ratio of the number of output true positive instances to the number of instances in an output positive instance set. The output positive instance set may include output true positive instances and output false positive instances. Specifically to some embodiments of the present disclosure, the model precision may be an output value of the loss function in the case of the determined trend weight and periodic weight.

Alternatively, the initial trend weight and the initial periodic weight may be adjusted in various ways. For example, the optimal solutions of the trend weight and the periodic weight may be determined using a Bayesian optimization or Gaussian process. However, it should be noted that a lot of computing resources and computing time are often required for the process of solving using the Bayesian optimization or Gaussian process.

Figure 4:
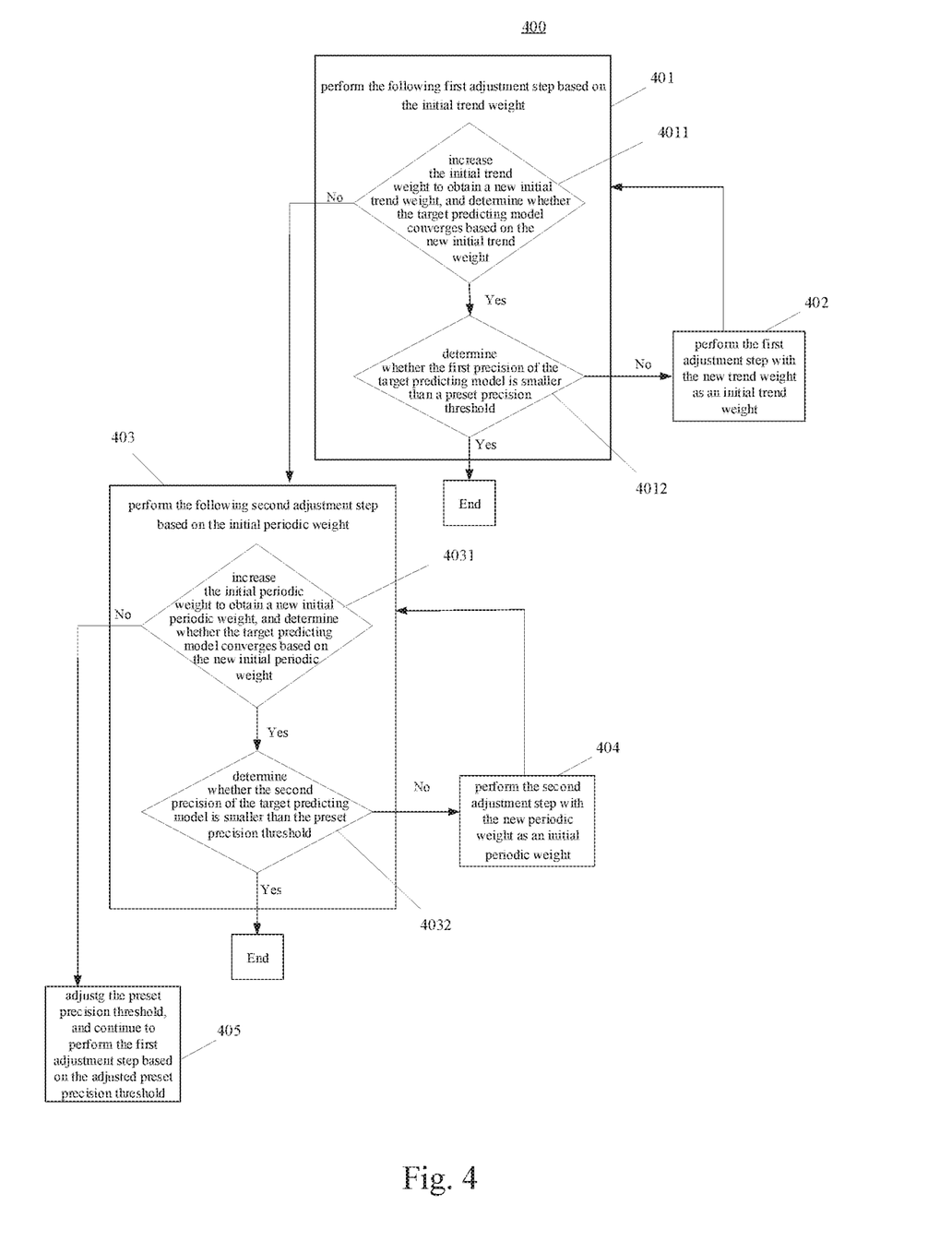
FIG. 4 is a schematic diagram of step 2042 according to an implementation of the present disclosure.

In some embodiments, step 2042 may be implemented by a flow 400 shown in FIG. 4. The flow 400 may include:

Step 401: performing a first adjustment step based on the initial trend weight.

Here, step 401 may include:

Step 4011: increasing the initial trend weight to obtain a new initial trend weight, and determining whether the target prediction model converges based on the new initial trend weight.

Step 4012: determining, in response to the target prediction model converging based on the new initial trend weight, whether a first precision of the target prediction model is smaller than a preset first precision threshold.

Here, step 401 may further include: ending the adjustment in response to the first precision of the target prediction model being smaller than the preset first precision threshold.

Step 402: performing, in response to the first precision of the target prediction model being not smaller than the preset first precision threshold, the first adjustment step with the new trend weight as an initial trend weight.

Step 402 may be regarded as a skip step.

Step 403: performing, in response to the target prediction model not converging based on the new initial trend weight, the following second adjustment step based on the initial periodic weight.

Here, step 403 may include:

Step 4031: increasing the initial periodic weight to obtain a new initial periodic weight, and determining whether the target prediction model converges based on the new initial periodic weight.

Step 4032: determining, in response to the target prediction model converging based on the new initial periodic weight, whether a second precision of the target prediction model is smaller than the preset first precision threshold.

Here, step 403 may include: ending the adjustment in response to the second precision of the target prediction model being smaller than the preset first precision threshold.

Step 404: performing, in response to the second precision of the target prediction model being not smaller than the first precision threshold, the second adjustment step with the new periodic weight as an initial periodic weight.

Here, step 404 may be regarded as a skip step.

Step 405: adjusting the preset first precision threshold in response to the target prediction model not converging based on the new initial periodic weight, and continuing to perform the first adjustment step based on the adjusted preset first precision threshold.

The new initial trend weight and (new) initial periodic weight at the end of the adjustment are determined as the trend weight and the periodic weight.

It should be noted that all "increases" in the flow 400 may also be modified to decreases.

It should be noted that the trend weight may be adjusted first, then if the current adjustment of the trend weight may cause the model to converge, it can be considered that the current adjustment has a positive influence on the model precision, and the adjustment of the trend weight continues till the precision requirement is met; otherwise, the periodic weight is adjusted, then if the current adjustment of the periodic weight may cause the model to converge, it can be considered that the current adjustment has a positive influence on the model precision, and the adjustment of the periodic weight continues till the precision requirement is met; if the model precision cannot meet the requirements by the adjustment of the trend weight and the periodic weight, the model precision is reduced, and a new round of adjustment of the trend weight or the periodic weight is performed till the model converges.

Figure 5:
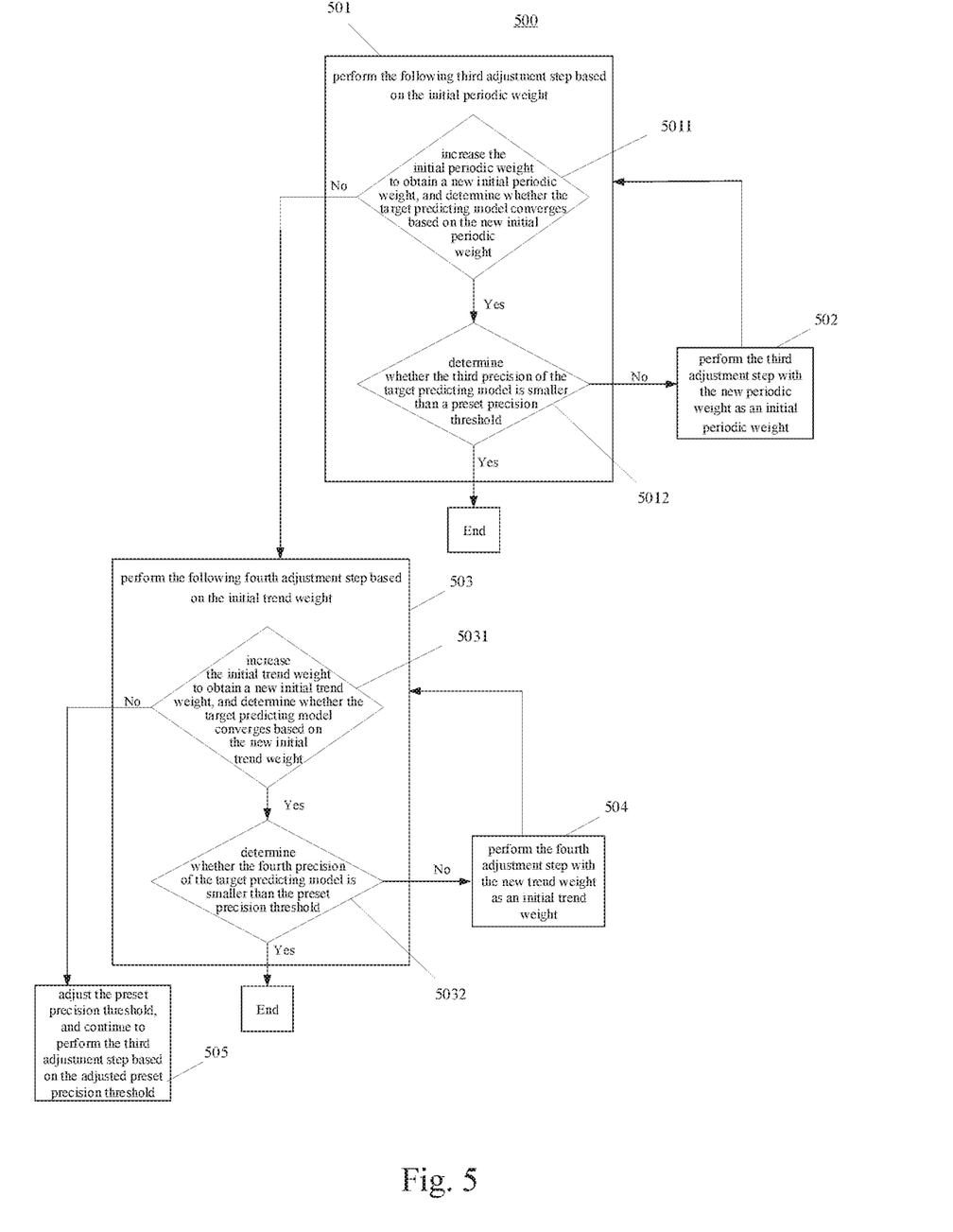
FIG. 5 is a schematic diagram of step 2042 according to another implementation of the present disclosure.

In some embodiments, step 2042 may be implemented by a flow 500 shown in FIG. 5. The flow 500 may include:

Step 501: performing a third adjustment step based on the initial periodic weight.

Here, step 501 may include:

Step 5011: increasing the initial periodic weight to obtain a new initial periodic weight, and determining whether the target prediction model converges based on the new initial periodic weight.

Step 5012: determining, in response to determining that the target prediction model converges based on the new initial periodic weight, whether a third precision of the target prediction model is smaller than a preset second precision threshold.

Step 501 may include: ending the adjustment in response to the third precision of the target prediction model being smaller than the preset second precision threshold.

Step 502: performing, in response to the third precision of the target prediction model being not smaller than the second precision threshold, the third adjustment step with the new periodic weight as an initial periodic weight.

Here, step 502 may be regarded as a skip step.

Step 503: performing, in response to the target prediction model does not converging based on the new initial periodic weight, a fourth adjustment step based on the initial trend weight.

Here, step 503 may include:

Step 5031: increasing the initial trend weight to obtain a new initial trend weight, and determining whether the target prediction model converges based on the new initial trend weight.

Step 5032: determining, in response to the target prediction model converging based on the new initial trend weight, whether the fourth precision of the target prediction model is smaller than the preset second precision threshold.

Step 503 may include: ending the adjustment in response to the fourth precision of the target prediction model being smaller than the preset second precision threshold.

Step 504: performing, in response to the fourth precision of the target prediction model being not smaller than the preset second precision threshold, the fourth adjustment step with the new trend weight as an initial trend weight.

Here, step 504 may be regarded as a skip step.

Step 505: adjusting the preset second precision threshold in response to determining that the target prediction model does not converge based on the new initial trend weight, and continuing to perform the third adjustment step based on the adjusted preset second precision threshold.

The new initial periodic weight and (new) initial trend weight at the end of the adjustment are determined as the periodic weight and the trend weight.

It should be noted that the periodic weight may be adjusted first, then if the current adjustment of the periodic weight may cause the model to converge, it can be considered that the current adjustment has a positive influence on the model precision, and the adjustment of the periodic weight continues till the precision requirement is met; otherwise, the trend weight is adjusted, then if the current adjustment of the trend weight may cause the model to converge, it can be considered that the current adjustment has a positive influence on the model precision, and the adjustment of the trend weight continues till the precision requirement is met; if the model precision cannot meet the requirements by the adjustment of the trend weight and the periodic weight, the model precision is reduced, and a new round of adjustment of the trend weight or the periodic weight is performed till the model converges.

It should be noted that the trend weight and the periodic weight of embodiments of the present disclosure can be automatically adjusted for the heterogeneous cloud services. While certain precision is maintained, and a faster solution speed is achieved, so that the prediction model adapted to the target cloud service can be quickly generated.

Figure 6:
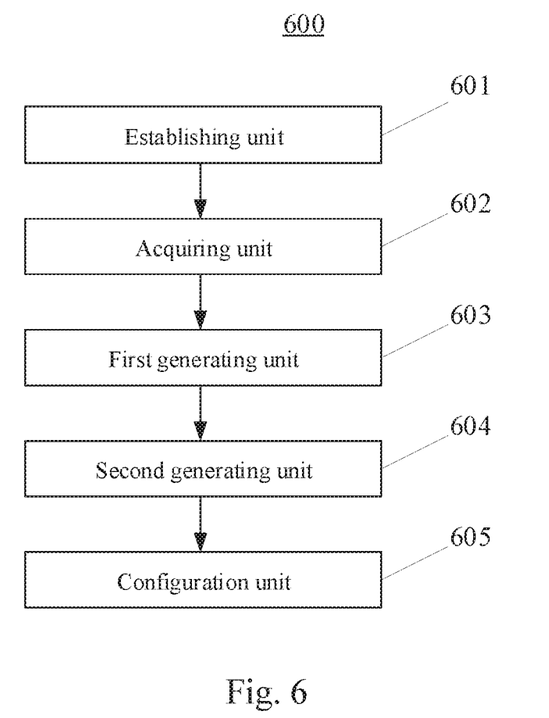
FIG. 6 is a schematic structural diagram of a resource configuration apparatus targeting heterogeneous cloud services according to an embodiment of the present disclosure.

Further, referring to FIG. 6, as an implementation of the method shown in the above figures, some embodiments the present disclosure provide a resource configuration apparatus for heterogeneous cloud services. The embodiment of the apparatus corresponds to the embodiment of the method shown in FIG. 2, and the apparatus specifically can be applied to various electronic devices.

As shown in FIG. 6, the resource configuration apparatus 600 for heterogeneous cloud services in the present embodiment includes: an establishing unit 601, configured to establish a basic model with a general structure for at least two heterogeneous cloud services, where the basic model includes a trend model and a periodic model; an acquiring unit 602, configured to determine a cloud service in the at least two cloud services as a target cloud service, and acquire a target historical data set of the target cloud service; a first generating unit 603, configured to train the trend model and the periodic model using the target historical data set, to generate a trained trend model and a trained periodic model; a second generating unit 604, configured to generate a target prediction model corresponding to the target cloud service based on the trained trend model and the trained periodic model; and a configuration unit 605, configured to generate, based on the target prediction model, a resource amount demanded by the target cloud service in a future time period, and configure resources for the target cloud service according to the demanded resource amount.

It should be noted that the implementation details of the units in the resource configuration apparatus oriented to heterogeneous cloud services according to some embodiments of the present disclosure and the technical effects thereof may be referred to the descriptions of other embodiments in the present disclosure, and details are not described herein again.

In some embodiments, the second generating unit is also configured to: acquire an initial trend weight and an initial periodic weight, where the initial trend weight is used to weight the first output result of the trained trend model, and the initial periodic weight is used to weight the second output result of the trained periodic model; and adjust, with the target prediction model converges as a goal, the initial trend weight and the initial periodic weight using the target historical data set of the target cloud service, to generate a trend weight and a periodic weight.

In some embodiments, the second generating unit is also configured to perform the following first adjustment step based on the initial trend weight: increasing the initial trend weight to obtain a new initial trend weight, and determining whether the target prediction model converges based on the new initial trend weight; determining, in response to the target prediction model converging based on the new initial trend weight, whether a first precision of the target prediction model is smaller than a preset first precision threshold; ending the adjustment in response to the first precision of the target prediction model being smaller than the preset first precision threshold; and performing, in response to the first precision of the target prediction model being not smaller than the preset first precision threshold, the first adjustment step with the new trend weight as an initial trend weight.

In some embodiments, the second generating unit is also configured to perform, in response to the target prediction model not converging based on the new initial trend weight, the following second adjustment step based on the initial periodic weight: increasing the initial periodic weight to obtain a new initial periodic weight, and determining whether the target prediction model converges based on the new initial periodic weight; determining, in response to the target prediction model converging based on the new initial periodic weight, whether a second precision of the target prediction model is smaller than the preset first precision threshold; ending the adjustment in response to the second precision of the target prediction model being smaller than the preset first precision threshold; and performing, in response to the second precision of the target prediction model being not smaller than the first precision threshold, the second adjustment step with the new periodic weight as an initial periodic weight.

In some embodiments, the second generating unit is also configured to: adjust the preset first precision threshold in response to the target prediction model does not converging based on the new initial periodic weight, and continue to perform the first adjustment step based on the adjusted preset first precision threshold.

In some embodiments, the second generating unit is also configured to perform the following third adjustment step based on the initial periodic weight: increasing the initial periodic weight to obtain a new initial periodic weight, and determining whether the target prediction model converges based on the new initial periodic weight; determining, in response to the target prediction model converging based on the new initial periodic weight, whether a third precision of the target prediction model is smaller than a preset second precision threshold; ending the adjustment in response to the third precision of the target prediction model being smaller than the preset second precision threshold; and performing, in response to the third precision of the target prediction model being not smaller than the second precision threshold, the third adjustment step with the new periodic weight as an initial periodic weight.

In some embodiments, the second generating unit is also configured to perform, in response to the target prediction model not converging based on the new initial periodic weight, the following fourth adjustment step based on the initial trend weight: increasing the initial trend weight to obtain a new initial trend weight, and determining whether the target prediction model converges based on the new initial trend weight; determining, in response to the target prediction model converging based on the new initial trend weight, whether the fourth precision of the target prediction model is smaller than the preset second precision threshold; ending the adjustment in response to the fourth precision of the target prediction model being smaller than the preset second precision threshold; and performing, in response to the fourth precision of the target prediction model being not smaller than the preset second precision threshold, the fourth adjustment step with the new trend weight as an initial trend weight.

In some embodiments, the second generating unit is also configured to: adjust the preset second precision threshold in response to the target prediction model not converging based on the new initial trend weight, and continue to perform the third adjustment step based on the adjusted preset second precision threshold.

In some embodiments, the basic model includes a burst factor model, where an input of the burst factor model is a specified burst demanded amount, and a third output result of the burst factor model is used to generate an output result of the target prediction model.

Figure 7:
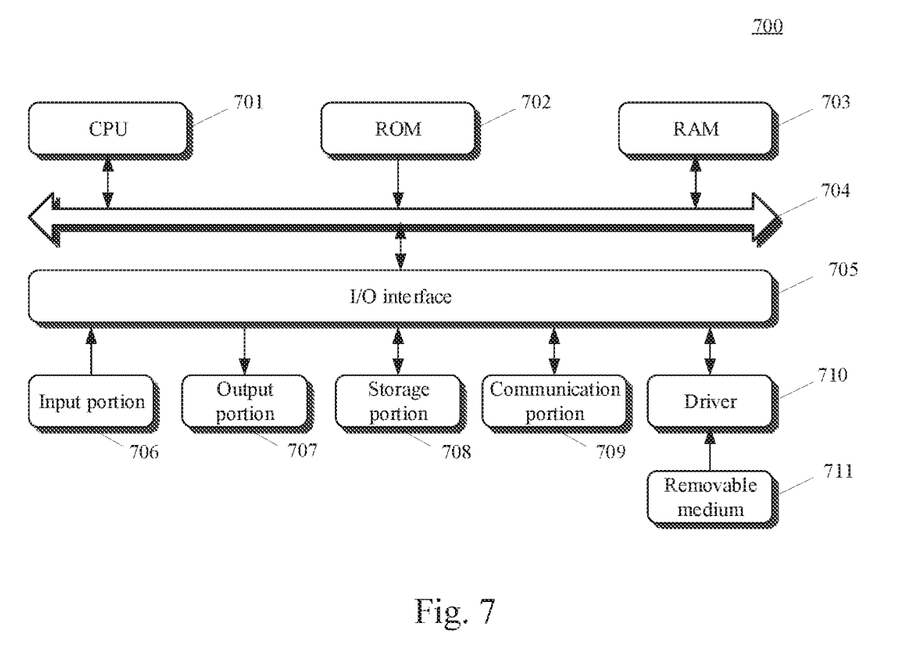
FIG. 7 is a schematic structural diagram of a computer system adapted to implement an electronic device of embodiments of the present disclosure.

Referring to FIG. 7, a schematic structural diagram of a computer system 700 adapted to implement a server of the embodiments of the present disclosure is shown. The server shown in FIG. 7 is merely an example, and should not limit the function and scope of use of the embodiments of the present disclosure.

As shown in FIG. 7, the computer system 700 includes a Central Processing Unit (CPU) 701, which can execute various appropriate operations and processes based on programs stored in a Read Only Memory (ROM) 702 or programs loaded from a storage portion 708 to a Random Access Memory (RAM) 703. Various programs and data required by the operations of the system 700 are also stored in the RAM 703. The CPU 701, the ROM 702, and the RAM 703 are connected to each other by a bus 704. An Input/Output (I/O) interface 705 is also connected to the bus 704.

The following parts are connected to the I/O interface 905: an input portion 706 including a keyboard, a mouse, etc.; an output portion 707 including a Cathode Ray Tube (CRT), a Liquid Crystal Display (LCD), a speaker, etc.; a storage portion 708 including a hard disk, etc.; and a communication portion 709 including a network interface card such as an LAN (Local Area Network) card and a modem. The communication portion 709 performs communication processes via a network, such as the Internet. A driver 710 is also connected to the I/O interface 705 as needed. A removable medium 711 such as a magnetic disk, an optical disk, a magneto-optical disk or a semiconductor memory is installed on the driver 710 as needed, so that a computer program read therefrom is installed in the storage portion 708 as needed.

In particular, according to some embodiments of the present disclosure, the process described above with reference to the flow chart may be implemented in a computer software program. For example, an embodiment of the present disclosure includes a computer program product, which comprises a computer program that is hosted in a machine-readable medium. The computer program comprises program codes for executing the method as illustrated in the flow chart. In such an embodiment, the computer program may be downloaded and installed from a network via the communication portion 709, or may be installed from the removeable medium 711. The computer program, when executed by the central processing unit (CPU) 701, implements the above mentioned functionalities as defined by the methods of the present disclosure. It should be noted that the computer readable medium in the present disclosure may be computer readable signal medium or computer readable storage medium or any combination of the above two. An example of the computer readable storage medium may include, but not limited to: electric, magnetic, optical, electromagnetic, infrared, or semiconductor systems, apparatus, elements, or a combination any of the above. A more specific example of the computer readable storage medium may include but is not limited to: electrical connection with one or more wire, a portable computer disk, a hard disk, a random access memory (RAM), a read only memory (ROM), an erasable programmable read only memory (EPROM or flash memory), a fibre, a portable compact disk read only memory (CD-ROM), an optical memory, a magnet memory or any suitable combination of the above. In some embodiments of the present disclosure, the computer readable storage medium may be any tangible medium containing or storing programs which can be used by a command execution system, apparatus or element or incorporated thereto. In some embodiments of the present disclosure, the computer readable signal medium may include data signal in the base band or propagating as parts of a carrier, in which computer readable program codes are carried. The propagating signal may take various forms, including but not limited to: an electromagnetic signal, an optical signal or any suitable combination of the above. The signal medium that can be read by computer may be any computer readable medium except for the computer readable storage medium. The computer readable medium is capable of transmitting, propagating or transferring programs for use by, or used in combination with, a command execution system, apparatus or element. The program codes contained on the computer readable medium may be transmitted with any suitable medium including but not limited to: wireless, wired, optical cable, RF medium etc., or any suitable combination of the above.

A computer program code for executing operations in some embodiments of the present disclosure may be compiled using one or more programming languages or combinations thereof. The programming languages include object-oriented programming languages, such as Java, Smalltalk or C++, and also include conventional procedural programming languages, such as "C" language or similar programming languages. The program code may be completely executed on a user's computer, partially executed on a user's computer, executed as a separate software package, partially executed on a user's computer and partially executed on a remote computer, or completely executed on a remote computer or server. In the circumstance involving a remote computer, the remote computer may be connected to a user's computer through any network, including local area network (LAN) or wide area network (WAN), or may be connected to an external computer (for example, connected through Internet using an Internet service provider).

The flow charts and block diagrams in the accompanying drawings illustrate architectures, functions and operations that may be implemented according to the systems, methods and computer program products of the various embodiments of the present disclosure. In this regard, each of the blocks in the flow charts or block diagrams may represent a module, a program segment, or a code portion, said module, program segment, or code portion comprising one or more executable instructions for implementing specified logic functions. It should also be noted that, in some alternative implementations, the functions denoted by the blocks may occur in a sequence different from the sequences shown in the figures. For example, any two blocks presented in succession may be executed, substantially in parallel, or they may sometimes be in a reverse sequence, depending on the function involved. It should also be noted that each block in the block diagrams and/or flow charts as well as a combination of blocks may be implemented using a dedicated hardware-based system executing specified functions or operations, or by a combination of a dedicated hardware and computer instructions.

The units involved in some embodiments of the present disclosure may be implemented by means of software or hardware. The described units may also be provided in a processor, for example, described as: a processor, including an establishing unit. Here, the names of these units do not in some cases constitute a limitation to such units themselves. For example, the establishing unit may also be described as "a unit configured to establish a model".

In another aspect, some embodiments of the present disclosure further provides a computer-readable medium. The computer-readable medium may be included in the apparatus described in the above embodiments, or a stand-alone computer-readable medium not assembled into the apparatus. The computer-readable medium stores one or more programs. The one or more programs, when executed by the apparatus, cause the apparatus to: establish a basic model with a general structure for at least two heterogeneous cloud services, where the basic model includes a trend model and a periodic model; determine a cloud service in the at least two cloud services as a target cloud service, and acquire a target historical data set of the target cloud service; train the trend model and the periodic model using the target historical data set, to generate a trained trend model and a trained periodic model; generate a target prediction model corresponding to the target cloud service based on the trained trend model and the trained periodic model; and generate, based on the target prediction model, a resource amount demanded by the target cloud service in a future time period, and configure resources for the target cloud service according to the demanded resource amount.

The above description only provides an explanation of the preferred embodiments of the present disclosure and the technical principles used. It should be appreciated by those skilled in the art that the inventive scope of the present disclosure is not limited to the technical solutions formed by the particular combinations of the above-described technical features. The inventive scope should also cover other technical solutions formed by any combinations of the above-described technical features or equivalent features thereof without departing from the concept of the disclosure. Technical schemes formed by the above-described features being interchanged with, but not limited to, technical features with similar functions disclosed in embodiments of the present disclosure are examples.

What is claimed is:

1. A resource configuration method for heterogeneous cloud services, comprising:
  establishing a basic model with a general structure for at least two heterogeneous cloud services, wherein the basic model comprises a trend model and a periodic model;
  determining a cloud service in the at least two cloud services as a target cloud service, and acquiring a target historical data set of the target cloud service;
  training the trend model and the periodic model using the target historical data set, to generate a trained trend model and a trained periodic model;
  generating a target prediction model corresponding to the target cloud service based on the trained trend model and the trained periodic model; and
  generating, based on the target prediction model, a resource amount demanded by the target cloud service in a future time period, and configuring resources for the target cloud service according to the demanded resource amount.

2. The method according to claim 1, wherein the generating a target prediction model corresponding to the target cloud service based on the trained trend model and the trained periodic model comprises:
  acquiring an initial trend weight and an initial periodic weight, wherein the initial trend weight is used to weight the first output result of the trained trend model, and the initial periodic weight is used to weight the second output result of the trained periodic model; and
  adjusting, with the target prediction model converges as a goal, the initial trend weight and the initial periodic weight using the target historical data set of the target cloud service, to generate a trend weight and a periodic weight.

3. The method according to claim 2, wherein the adjusting, with the target prediction model converges as a goal, the initial trend weight and the initial periodic weight using the target historical data set of the target cloud service, to generate a trend weight and a periodic weight comprises:

performing the following first adjustment step based on the initial trend weight: increasing the initial trend weight to obtain a new initial trend weight, and determining whether the target prediction model converges based on the new initial trend weight; determining, in response to the target prediction model converging based on the new initial trend weight, whether a first precision of the target prediction model is smaller than a preset first precision threshold; ending the adjustment in response to the first precision of the target prediction model being smaller than the preset first precision threshold; and     performing, in response to the first precision of the target prediction model being not smaller than the preset first precision threshold, the first adjustment step with the new trend weight as an initial trend weight.

4. The method according to claim 3, wherein the adjusting, with the target prediction model converges as a goal, the initial trend weight and the initial periodic weight using the target historical data set of the target cloud service, to generate a trend weight and a periodic weight comprises:

performing, in response to the target prediction model not converging based on the new initial trend weight, the following second adjustment step based on the initial periodic weight: increasing the initial periodic weight to obtain a new initial periodic weight, and determining whether the target prediction model converges based on the new initial periodic weight; determining, in response to the target prediction model converging based on the new initial periodic weight, whether a second precision of the target prediction model is smaller than the preset first precision threshold; ending the adjustment in response to the second precision of the target prediction model being smaller than the preset first precision threshold; and     performing, in response to the second precision of the target prediction model being not smaller than the first precision threshold, the second adjustment step with the new periodic weight as an initial periodic weight.

5. The method according to claim 4, wherein the adjusting, with the target prediction model converges as a goal, the initial trend weight and the initial periodic weight using the target historical data set of the target cloud service, to generate a trend weight and a periodic weight also comprises:

adjusting the preset first precision threshold in response to the target prediction model not converging based on the new initial periodic weight, and continuing to perform the first adjustment step based on the adjusted preset first precision threshold.

6. The method according to claim 2, wherein the adjusting, with the target prediction model converges as a goal, the initial trend weight and the initial periodic weight using the target historical data set of the target cloud service, to generate a trend weight and a periodic weight comprises:

performing the following third adjustment step based on the initial periodic weight: increasing the initial periodic weight to obtain a new initial periodic weight, and determining whether the target prediction model converges based on the new initial periodic weight; determining, in response to the target prediction model converging based on the new initial periodic weight, whether a third precision of the target prediction model is smaller than a preset second precision threshold; ending the adjustment in response to the third precision of the target prediction model being smaller than the preset second precision threshold; and     performing, in response to the third precision of the target prediction model being not smaller than the second precision threshold, the third adjustment step with the new periodic weight as an initial periodic weight.

7. The method according to claim 6, wherein the adjusting, with the target prediction model converges as a goal, the initial trend weight and the initial periodic weight using the target historical data set of the target cloud service, to generate a trend weight and a periodic weight comprises:

performing, in response to the target prediction model not converging based on the new initial periodic weight, the following fourth adjustment step based on the initial trend weight: increasing the initial trend weight to obtain a new initial trend weight, and determining whether the target prediction model converges based on the new initial trend weight; determining, in response to the target prediction model converging based on the new initial trend weight, whether the fourth precision of the target prediction model is smaller than the preset second precision threshold; ending the adjustment in response to the fourth precision of the target prediction model being smaller than the preset second precision threshold; and     performing, in response to the fourth precision of the target prediction model being not smaller than the preset second precision threshold, the fourth adjustment step with the new trend weight as an initial trend weight.

8. The method according to claim 7, wherein the adjusting, with the target prediction model converges as a goal, the initial trend weight and the initial periodic weight using the target historical data set of the target cloud service, to generate a trend weight and a periodic weight also comprises:

adjusting the preset second precision threshold in response to the target prediction model not converging based on the new initial trend weight, and continuing to perform the third adjustment step based on the adjusted preset second precision threshold.

9. The method according to claim 1, wherein the basic model comprises a burst factor model, wherein an input of the burst factor model is a specified burst demanded amount, and a third output result of the burst factor model is used to generate an output result of the target prediction model.

10. A resource configuration apparatus for heterogeneous cloud services, comprising:

at least one processor; and a memory storing instructions, the instructions when executed by the at least one processor, cause the at least one processor to perform operations, the operations comprising:

establishing a basic model with a general structure for at least two heterogeneous cloud services, wherein the basic model comprises a trend model and a periodic model;

determining a cloud service in the at least two cloud services as a target cloud service, and acquiring a target historical data set of the target cloud service;

training the trend model and the periodic model using the target historical data set, to generate a trained trend model and a trained periodic model;

generating a target prediction model corresponding to the target cloud service based on the trained trend model and the trained periodic model; and generating, based on the target prediction model, a resource amount demanded by the target cloud service in a future time period, and configuring resources for the target cloud service according to the demanded resource amount.

11. The apparatus according to claim 10, wherein the generating a target prediction model corresponding to the target cloud service based on the trained trend model and the trained periodic model comprises:
acquiring an initial trend weight and an initial periodic weight, wherein the initial trend weight is used to weight the first output result of the trained trend model, and the initial periodic weight is used to weight the second output result of the trained periodic model; and
adjusting, with the target prediction model converges as a goal, the initial trend weight and the initial periodic weight using the target historical data set of the target cloud service, to generate a trend weight and a periodic weight.

12. The apparatus according to claim 11, wherein the adjusting, with the target prediction model converges as a goal, the initial trend weight and the initial periodic weight using the target historical data set of the target cloud service, to generate a trend weight and a periodic weight comprises:
performing the following first adjustment step based on the initial trend weight: increasing the initial trend weight to obtain a new initial trend weight, and determining whether the target prediction model converges based on the new initial trend weight; determining, in response to the target prediction model converging based on the new initial trend weight, whether a first precision of the target prediction model is smaller than a preset first precision threshold; ending the adjustment in response to the first precision of the target prediction model being smaller than the preset first precision threshold; and
performing, in response to the first precision of the target prediction model being not smaller than the preset first precision threshold, the first adjustment step with the new trend weight as an initial trend weight.

13. The apparatus according to claim 12, wherein the adjusting, with the target prediction model converges as a goal, the initial trend weight and the initial periodic weight using the target historical data set of the target cloud service, to generate a trend weight and a periodic weight comprises:
performing, in response to the target prediction model not converging based on the new initial trend weight, the following second adjustment step based on the initial periodic weight: increasing the initial periodic weight to obtain a new initial periodic weight, and determining whether the target prediction model converges based on the new initial periodic weight; determining, in response to the target prediction model converging based on the new initial periodic weight, whether a second precision of the target prediction model is smaller than the preset first precision threshold; ending the adjustment in response to the second precision of the target prediction model being smaller than the preset first precision threshold; and
performing, in response to the second precision of the target prediction model being not smaller than the first precision threshold, the second adjustment step with the new periodic weight as an initial periodic weight.

14. The apparatus according to claim 13, wherein the adjusting, with the target prediction model converges as a goal, the initial trend weight and the initial periodic weight using the target historical data set of the target cloud service, to generate a trend weight and a periodic weight also comprises:
adjusting the preset first precision threshold in response to the target prediction model not converging based on the new initial periodic weight, and continuing to perform the first adjustment step based on the adjusted preset first precision threshold.

15. The apparatus according to claim 11, wherein the adjusting, with the target prediction model converges as a goal, the initial trend weight and the initial periodic weight using the target historical data set of the target cloud service, to generate a trend weight and a periodic weight comprises:
performing the following third adjustment step based on the initial periodic weight: increasing the initial periodic weight to obtain a new initial periodic weight, and determining whether the target prediction model converges based on the new initial periodic weight; determining, in response to the target prediction model converging based on the new initial periodic weight, whether a third precision of the target prediction model is smaller than a preset second precision threshold; ending the adjustment in response to the third precision of the target prediction model being smaller than the preset second precision threshold; and
performing, in response to the third precision of the target prediction model being not smaller than the second precision threshold, the third adjustment step with the new periodic weight as an initial periodic weight.

16. The apparatus according to claim 15, wherein the adjusting, with the target prediction model converges as a goal, the initial trend weight and the initial periodic weight using the target historical data set of the target cloud service, to generate a trend weight and a periodic weight comprises:
performing, in response to the target prediction model not converging based on the new initial periodic weight, the following fourth adjustment step based on the initial trend weight: increasing the initial trend weight to obtain a new initial trend weight, and determining whether the target prediction model converges based on the new initial trend weight; determining, in response to the target prediction model converging based on the new initial trend weight, whether the fourth precision of the target prediction model is smaller than the preset second precision threshold; ending the adjustment in response to the fourth precision of the target prediction model being smaller than the preset second precision threshold; and
performing, in response to the fourth precision of the target prediction model being not smaller than the preset second precision threshold, the fourth adjustment step with the new trend weight as an initial trend weight.

17. The apparatus according to claim 16, wherein the adjusting, with the target prediction model converges as a goal, the initial trend weight and the initial periodic weight using the target historical data set of the target cloud service, to generate a trend weight and a periodic weight also comprises:
adjusting the preset second precision threshold in response to the target prediction model not converging based on the new initial trend weight, and continuing to perform the third adjustment step based on the adjusted preset second precision threshold.

18. The apparatus according to claim 10, wherein the basic model comprises a burst factor model, wherein an input of the burst factor model is a specified burst demanded amount, and a third output result of the burst factor model is used to generate an output result of the target prediction model.

19. A non-transitory computer-readable storage medium, storing a computer program thereon, wherein the computer program, when executed by a processor, causes the processor to perform operations, the operations comprise:
- establishing a basic model with a general structure for at least two heterogeneous cloud services, wherein the basic model comprises a trend model and a periodic model;
- determining a cloud service in the at least two cloud services as a target cloud service, and acquiring a target historical data set of the target cloud service;
- training the trend model and the periodic model using the target historical data set, to generate a trained trend model and a trained periodic model;
- generating a target prediction model corresponding to the target cloud service based on the trained trend model and the trained periodic model; and
- generating, based on the target prediction model, a resource amount demanded by the target cloud service in a future time period, and configuring resources for the target cloud service according to the demanded resource amount.

20. The medium according to claim 19, wherein the generating a target prediction model corresponding to the target cloud service based on the trained trend model and the trained periodic model comprises:
- acquiring an initial trend weight and an initial periodic weight, wherein the initial trend weight is used to weight the first output result of the trained trend model, and the initial periodic weight is used to weight the second output result of the trained periodic model; and
- adjusting, with the target prediction model converges as a goal, the initial trend weight and the initial periodic weight using the target historical data set of the target cloud service, to generate a trend weight and a periodic weight.

* * * * *